United States Patent [19]

Hsu

[11] Patent Number: 4,764,482
[45] Date of Patent: Aug. 16, 1988

[54] METHOD OF FABRICATING AN INTEGRATED CIRCUIT CONTAINING BIPOLAR AND MOS TRANSISTORS

[75] Inventor: Sheng T. Hsu, West Windsor Township, Mercer County, N.J.

[73] Assignee: General Electric Company, Schenectady, N.Y.

[21] Appl. No.: 124,129

[22] Filed: Nov. 23, 1987

Related U.S. Application Data

[63] Continuation-in-part of Ser. No. 933,559, Nov. 21, 1986, abandoned.

[51] Int. Cl.⁴ .......................................... H01L 21/425
[52] U.S. Cl. ...................................... 437/57; 437/31; 437/41; 437/59
[58] Field of Search ...................... 437/31, 41, 57, 59

[56] References Cited

U.S. PATENT DOCUMENTS

| | | | |
|---|---|---|---|
| 4,038,107 | 7/1977 | Marr et al. | 437/41 X |
| 4,120,707 | 10/1978 | Beasom | 437/56 |
| 4,280,855 | 7/1981 | Bertin et al. | 437/44 |
| 4,346,512 | 8/1982 | Liang et al. | 437/59 |
| 4,375,999 | 3/1983 | Nawata et al. | 437/46 |
| 4,403,395 | 9/1983 | Curran | 437/31 |
| 4,475,279 | 10/1984 | Gahle | 437/31 |
| 4,578,128 | 3/1986 | Mundt et al. | 437/67 |
| 4,597,824 | 7/1986 | Shinada et al. | 437/164 X |
| 4,604,790 | 8/1986 | Bonn | 437/57 |
| 4,637,125 | 1/1987 | Iwasaki et al. | 437/57 |
| 4,694,562 | 9/1987 | Iwasaki et al. | 437/57 |
| 4,717,684 | 1/1988 | Katto et al. | 437/57 X |

OTHER PUBLICATIONS

*Electronics*, vol. 54, No. 7, "Power Transistors Unite MOS, Bipolar", pp. 44, Apr. 21, 1981.

S. Ogura, IEDM, Tech. Dig., "A Half Micron Mosfet Using Double Implanted LDD", San Francisco, Calif., Dec. 13-15, 1982, pp. 718-721.

*Primary Examiner*—George T. Ozaki
*Attorney, Agent, or Firm*—Henry I. Steckler; Paul R. Webb, II; James C. Davis, Jr.

[57] ABSTRACT

A method for fabricating an integrated circuit including at least one metal-oxide-semiconductor transistor (MOS) and at least one bipolar transistor is disclosed. The pocket regions used to reduce the short channel effect in the MOS transistor are formed simultaneously with the base region for the bipolar transistor.

7 Claims, 4 Drawing Sheets

METHOD OF FABRICATING AN INTEGRATED CIRCUIT CONTAINING BIPOLAR AND MOS TRANSISTORS

This is a continuation-in-part of application Ser. No. 933,559, filed Nov. 21, 1986, now abandoned, the priority of which is hereby claimed.

This invention relates to a method of fabricating an integrated circuit. More particularly, the present invention provides a simplified method for fabricating both bipolar and metal-oxide-semiconductor (MOS) transistors in a single semiconductor substrate.

BACKGROUND OF THE INVENTION

In recent years complimentary metal-oxide-semiconductor (CMOS) devices have been used in very large scale integration (VLSI) circuits because of their high density and low power dissipation. However, when compared to bipolar devices, CMOS devices are considered to have low output drive capabilities and slow operating speeds. In order to overcome these disadvantages, bipolar metal-oxide-semiconductor (BIMOS) devices or bipolar complimentary metal-oxide-semiconductor (BICMOS) have been developed to increase both the speed and the output drive capabilities of the CMOS circuit. BICMOS devices generally include a CMOS integrated circuit with the drain regions of both the PMOS and NMOS transistors electrically connected to the base region of the bipolar transistor.

Several methods have been developed to fabricate both bipolar and MOS transistors in a single semiconductor substrate. One such method is described by H. Gahle in U.S. Pat. No. 4,475,279, entitled "Method of Making A Monolithic Integrated Circuit Comprising At Least One Pair of Complementary Field-Effect Transistors And At Least One Bipolar Transistor," issued Oct. 9, 1984. During the fabrication process for the CMOS devices, an additional masking and implantation step is carried out to form the base region of the bipolar transistor. The remaining components of the bipolar transistor are formed during the process steps used to form both the NMOS and PMOS transistors. Both the emitter region and the collector contact region are formed by diffusing impurities from the overlying emitter and collector electrodes, respectively. This process has the disadvantage of not being able to control the depth of the emitter region and the collector contact region because a diffusion technique is used to form these regions.

A method for fabricating bipolar and complimentary metal-oxide-semiconductor devices is also disclosed by V. Liang et al. in U.S. Pat. No. 4,346,512, entitled "Integrated Circuit Manufacturing Method," issued Aug. 31, 1982. In this process the base region for the NPN transistor is formed during the source and drain implantation step for the PMOS transistor. However, this method does not provide for a base contact region. Additionally, the source and drain regions are not self-aligned relative to the gate electrodes. Therefore, it is difficult to achieve high device densities utilizing this process.

There is a need for a method of fabricating VSLI circuits containing bipolar transistors and metal-oxide-semiconductor field-effect transistors having channel lengths in the submicron range. The MOS transistors produced by this method should have pocket regions, such as those described by S. Ogura et al. in the article entitled "A Half Micron MOSFET Using Double Implanted LDD," International Electron Device Meeting Technical Digest, 1982, pp. 718-721, so as to reduce the short channel effect associated with submicron channel length devices. The use of pocket regions to reduce the short channel effect is also described in U.S. Pat. No. 4,597,824, entitled "Method of Producing Semiconductor Device," issued July 1, 1986, to K. Shinada et al. Also, it would be desireable to fabricate a BICMOS integrated circuit using standard CMOS processing steps so that no additional ion implantation steps would be required to simultaneously form the bipolar transistor.

SUMMARY OF THE INVENTION

The present invention provides a method of forming an integrated circuit including at least one metal-oxide-semiconductor transistor and at least one bipolar transistor. The pocket regions for the metal-oxide-semiconductor transistor are formed simultaneously with the base region for the bipolar transistor.

DETAILED DESCRIPTION OF PREFERRED EMBODIMENT

Figure 1:
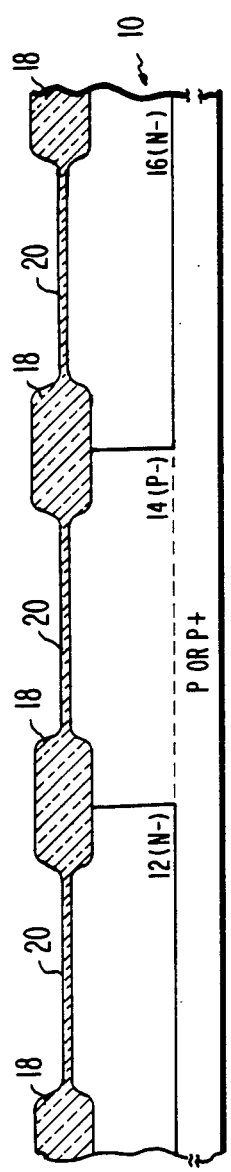
FIGS. 1-6 are cross-sectional views illustrating the method of the present invention for fabricating both CMOS and NPN bipolar devices.

Referring to FIG. 1, the method of the present invention for fabricating an integrated circuit containing CMOS and NPN bipolar devices begins with a semiconductor substrate 10, such as a body of P or P+ single crystalline silicon. Alternatively, the semiconductor substrate 10 may be a body of semiconductor material with a layer of P-type epitaxial silicon formed thereon by conventional chemical vapor deposition techniques (not shown). Silicon dioxide isolation regions 18 are then formed on the semiconductor substrate using conventional local oxidation of silicon (LOCOS) techniques. Aternatively, trench isolation regions (not shown) could be used in place of the silicon dioxide regions 18 formed by the LOCOS technique.

The semiconductor substrate 10 is then ion implanted with N-type dopants, such as phosphorus, to form the lightly doped N-wells 12 and 16. The N-wells 12 and 16 and a P-type region 14, disposed between the N-wells 12 and 16, have an impurity concentration of about $1 \times 10^{16}$ cm$^{-3}$. The light doping of the P region 14 as compared to the lower portion of the substrate 10 can be obtained by reducing the dopant during epitaxial growth. Although the substrate 10 has been prepared using an N-well technique, the present invention is also applicable to N-type semiconductor substrates (not shown) containing P-wells (not shown). Additionally, the method of the present invention may also employ a semiconductor substrate containing twin tubs. A gate oxide layer 20 is then formed by heating the substrate 10 to a temperature of approximately 850° C. in an atmosphere comprising oxygen and steam.

Figure 2:
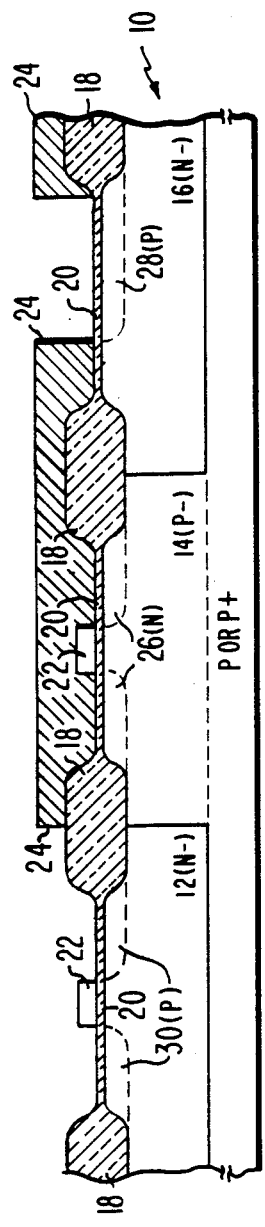

As shown in FIG. 2, gate electrodes 22 are formed over the N-well 12 and the P-type region 14 where the PMOS and NMOS transistors will be located, respectively. The gate electrodes 22 are typically formed by depositing a layer of N-type polycrystalline silicon over the structure illustrated in FIG. 1. Then, conventional photolithographic and etching techniques are used to define the gates. A first layer of photoresist 24 is then deposited over the entire structure and patterned to form openings to expose the N-type region 12 and a portion of the N-well 16 used to form the NPN bipolar transistor. Then, boron is ion implanted into the exposed regions using an energy of about 60 keV and a dosage of about $1 \times 10^{13}$ cm$^{-2}$. The boron ions which are implanted in the N-type region 12 form the P-type pocket regions 30 having a doping concentration of approximately $1 \times 10^{18}$ cm$^{-3}$. These P-type pocket regions implanted in the area where the PMOS device will be located are used to reduce the short channel effect in submicron MOS semiconductor devices. During the pocket implantation step for the PMOS transistor, a P-type base region 28 is simultaneously formed in the N-well 16 where the NPN bipolar transistor will be located. The first photoresist layer 24 is then removed using a conventional solvent.

An additional photoresist layer (not shown) is applied and patterned so as to only expose the P-well 14 where the NMOS transistor will be located. Then, phosphorus is implanted into the P-well 14 using an energy of about 100 keV and a dosage of about $5 \times 10^{13}$ cm$^{-2}$ to form the N-type pocket regions 26 used to reduce the short channel effect in the NMOS transistor. The additional photoresist (not shown) is removed using a suitable solvent.

Figure 3:
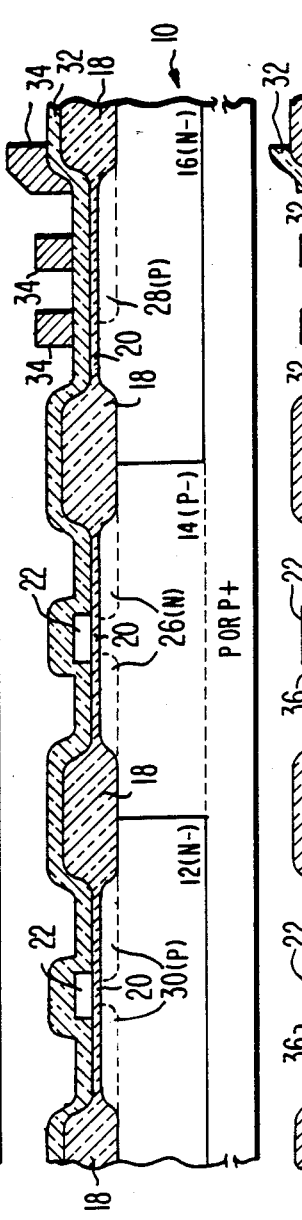

As shown in FIG. 3, a silicon dioxide layer 32 is deposited over the entire device using conventional plasma chemical vapor deposition techniques. The silicon dioxide layer 32 has a thickness of about 0.2 micron. Then, a photoresist layer 34 is deposited over the silicon dioxide layer 32. The photoresist layer 34 is patterned using conventional photolithographic techniques so that the areas which overlie the emitter, base contact and collector contact of the NPN bipolar transistor are uncovered. Also, the regions which overlie the N-well 12 and the P-type region 14 remain uncovered.

Figure 4:
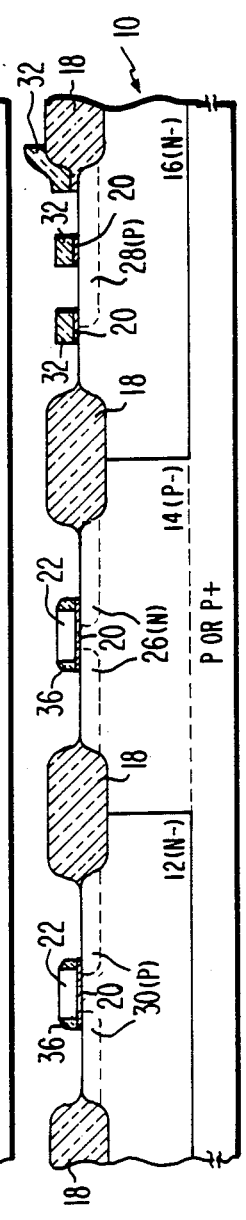

The structure shown in FIG. 3 is then etched using a conventional anisotropic plasma etchant, such as chlorine. As shown in FIG. 4, oxide spacers 36, having a thickness of about 0.15 micron, remain on the vertical sidewalls of the gate electrodes 22. Also, the masked portions of the silicon dioxide layer 32 and the gate oxide layer 20 remain over the N-well 16 where the bipolar transistor is to be fabricated.

Figure 5:
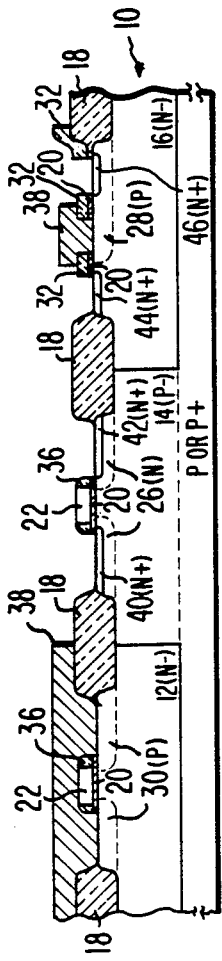

As shown in FIG. 5, the N-well 12 and the portion of the N-well 16 where the base contact is to be located are covered with a photoresist layer 38. Then, the source and drain regions 40 and 42, respectively, for the NMOS transistor are formed in the P-type region 14 by implanting arsenic using an energy of about 100 keV and a dosage of about $4 \times 10^{15}$ cm$^{-2}$. During this implantation step, a collector contact 44 and an emitter region 46 for the NPN bipolar transistor are also formed in the N-well 16. These heavily doped N-type regions 40, 42, 44 and 46 have an impurity concentration of about $1 \times 10^{20}$ cm$^{-3}$. Then, the photoresist layer 38 is removed using a conventional solvent.

Figure 6:
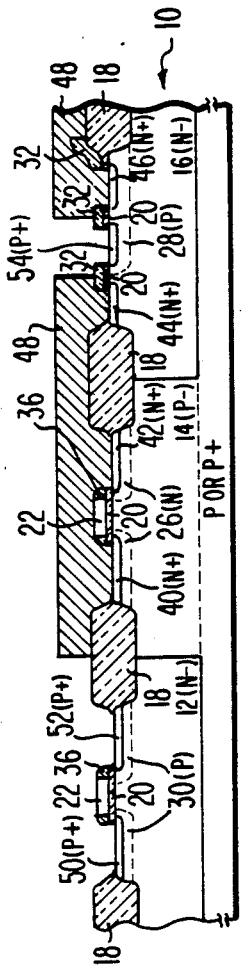

Referring now to FIG. 6, an additional photoresist layer 48 is applied over the device and patterned so that the N-well 12 and the portion of the N-well 16 where the base contact is to be located are left exposed. Then, boron difluoride is implanted using an energy of about 40 keV and a dosage of about $4 \times 10^{15}$ cm$^{-2}$. This implantation step forms the source and drain regions 50 and 52, respectively, for the PMOS transistor located in the N-well 12. During this implantation step, a base contact 54 for the NPN bipolar transistor is also simultaneously formed. All of these heavily doped P-type regions 50, 52 and 54 have an impurity concentration of about $1 \times 10^{20}$ cm$^{-3}$. The photoresist layer 48 is then removed.

Finally, the device is completed using conventional processing techniques (not shown). For example, tungsten would be selectively deposited on the source and drain regions, the gate electrodes, the emitter region, the base contact region and the collector contact region using a low pressure chemical vapor deposition technique. The structure would then be heated to a temperature of approximatey 1000° C. to form a tungsten silicide. An insulating material, such as borophososilicate glass (BPSG), would then be deposited over the entire structure. This layer would then be heated to cause it to flow. Then, openings would be formed in the BPSG layer so that electrical contact can be made with any subsequent layer of metallization.

A PNP bipolar transistor could also be simultaneously formed with the CMOS device and the NPN bipolar transistor using the process steps outlined above. The base region of the PNP bipolar transistor would be formed in a P-type region of the semiconductor substrate during the step in which the N-type pocket regions 26 are formed in the P-well 14. Then, the base contact region for the PNP bipolar transistor would be formed simultaneously when the source and drain regions 40 and 42, respectively, for the NMOS transistor are formed. The emitter region and the collector contact would be formed when the P-type source and drain regions 50 and 52, respectively, for the PMOS device are formed. However, since the semiconductor substrate is of the P-type, the PNP bipolar transistor would not be electrically isolated from other devices within the integrated circuit. Thus, an alternative process of the present invention illustrated in FIGS. 7–11 has been developed to form an isolated PNP transistor with both the CMOS device and the NPN transistor.

Figure 7:
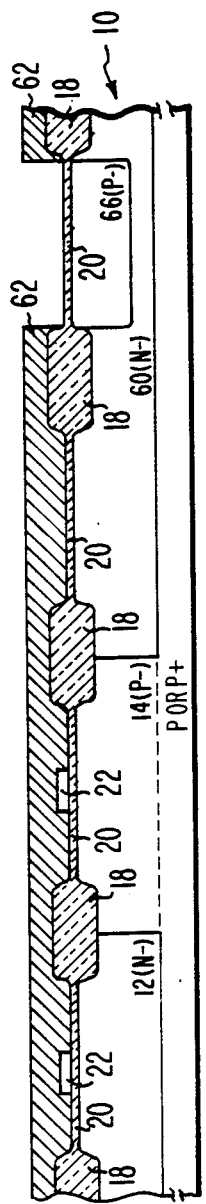
FIGS. 7-11 are cross-sectional views illustrating an alternative method of the present invention for fabricating CMOS devices and NPN and PNP bipolar transistors.

Referring now to FIG. 7, this alternative method begins with a P-type semiconductor substrate 10. The reference numerals which are common to FIGS. 1–6 and 7–11 identify like parts. FIG. 7 illustrates that an N-type well 60 is provided for both the NPN and PNP bipolar transistors. The N-wells 12 and 60, the P-type reqion 14, the isolation regions 18, the gate oxide layer 20 and the gate electrodes 22 are all formed using the technique described above with regard to FIG. 1. The N-well 60 contains an isolation region 18 between the areas where the PNP and NPN transistors are to be located. However, this isolation region between the two bipolar transistors may be omitted. Then, a photoresist layer 62 is applied over the entire device and patterned so that the portion of the N-well 60 where the PNP transistor is to be located is exposed. Boron is then implanted using an energy of about 180 keV and a dosage of about $1 \times 10^{13}$ cm$^{-2}$ so that a lightly doped P-well 66 is formed within the N-well 60. This P-well 66 has an impurity concentration of about $1 \times 10^{17}$ cm$^{-3}$.

Since the junction of the P-well 66 and the N-well 60 are never forward biased in operation, it will isolate the PNP transistor from the other devices formed within the integrated circuit. The photoresist layer 62 is then removed using a conventional solvent.

Figure 8:
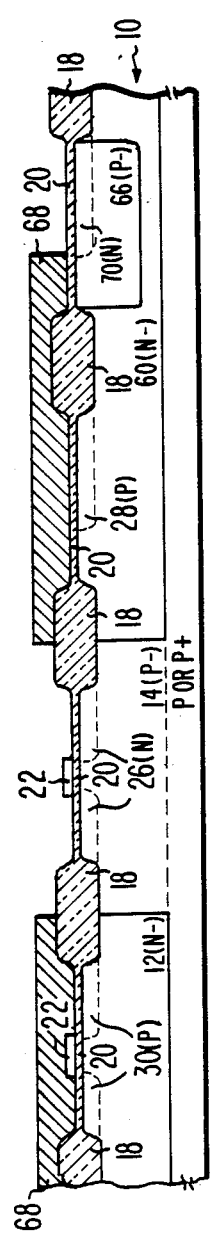

After this additional doping step to form the P-well 66 for the PNP transistor, the process proceeds in a manner which is analogous to the method illustrated by FIGS. 2-6. The P-type pocket regions 30 and the P-type base region 28 (FIG. 8) are simultaneously formed while the P-well 14 and the P-well 66 are covered with a photoresist (not shown). This photoresist (not shown) is then removed. As shown in FIG. 8, an additional photoresist layer 68 is then applied and patterned so that the P-well 14 and a portion of the P-well 66 are left exposed. Then, phosphorus is implanted into the exposed regions using an energy of about 100 keV and a dosage of about $5 \times 10^{13}$ cm$^{-2}$. The N-type pocket regions 26 for the NMOS transistor and the N-type base region 70 for the PNP bipolar transistor are simultaneously formed. The photoresist layer 68 is then removed.

Figure 9:
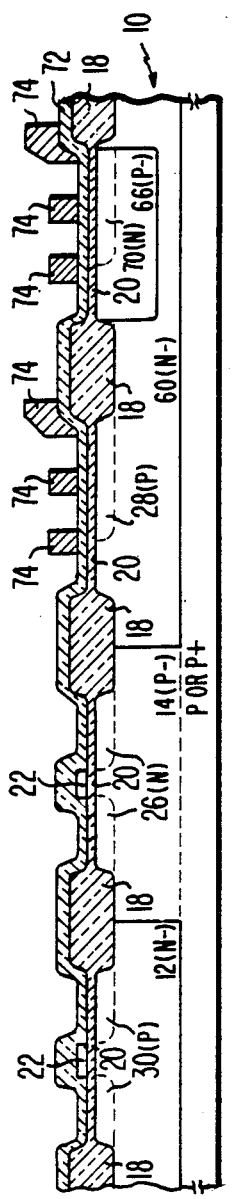

As shown in FIG. 9, a silicon dioxide layer 72 having a thickness of about 0.2 micron is deposited using conventional plasma chemical vapor deposition techniques. A photoresist layer 74 is deposited and patterned so that the regions of the N-well 60 and the P-well 66 which correspond to the emitter contact, the base contact and the collector contact are left exposed. The N-well 12 and the P-type region 14 are also left exposed. The entire device is then anisotropically plasma etched so that the oxide spacers 36 (FIG. 10) are formed on the vertical walls of the gate electrodes 22. Also, the portions of the silicon dioxide layer 72 and the gate oxide layer 20 which were covered by the photoresist 74 remain over the N-well 60 and the P-well 66. The photoresist 74 is then removed using a conventional solvent.

Figure 10:
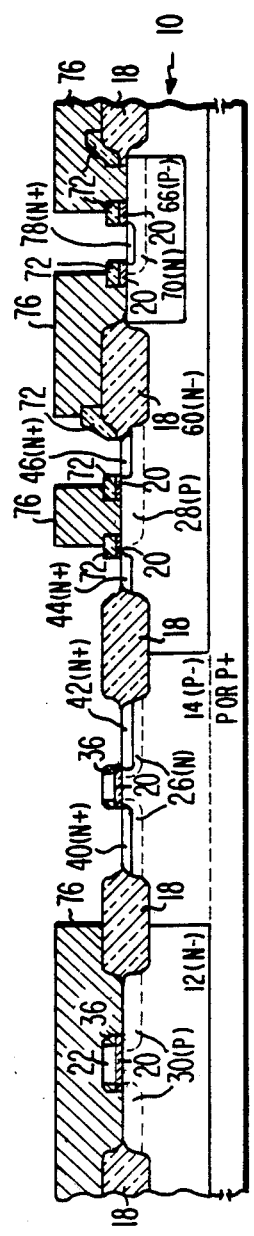

As also shown in FIG. 10, a photoresist layer 76 is applied over the device and patterned in the manner shown. The photoresist layer 76 is used to mask the N-well 12, the base contact region of the NPN transistor and both the emitter region and collector contact for the PNP transistor. Then, arsenic is implanted using the conditions described earlier with regard to FIG. 5 so as to form the N-type source and drain regions 40 and 42, respectively, for the NMOS device. Also, the emitter region 46 and the collector contact 44 for the NPN transistor and the base contact 78 for the PNP transistor are simultaneously formed. The photoresist layer 76 is then removed using a conventional solvent.

Figure 11:
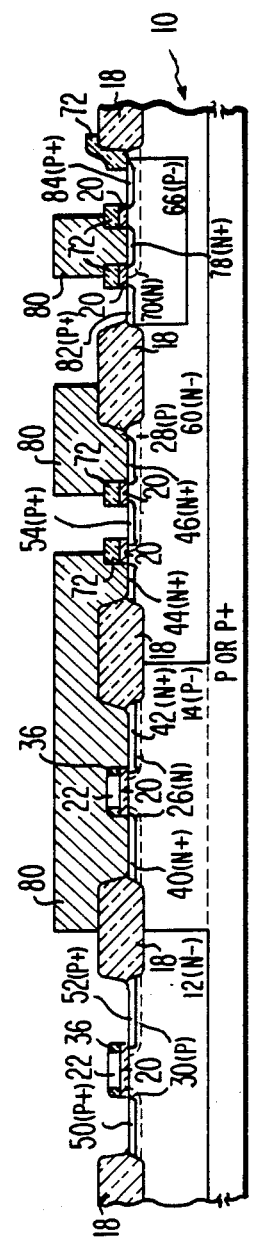

As illustrated in FIG. 11, a photoresist layer 80 is applied over the device and patterned so that the P-type region 14, the emitter region 46 and the collector contact 44 for the NPN transistor, and the base contact 78 for the PNP transistor are covered. Boron difluoride is then implanted into the exposed areas using the implant conditions described earlier with regard to FIG. 6. This implantation step forms the source and drain regions 50 and 52, respectively, for the PMOS transistor, the base contact 54 for the NPN bipolar transistor and both the emitter region 84 and the collector contact 82 for the PNP bipolar transistor. The photoresist layer 80 is removed using a suitable solvent. Then, the device is completed using the conventional processing techniques described above with regard to FIGS. 1-6.

Figure 12:
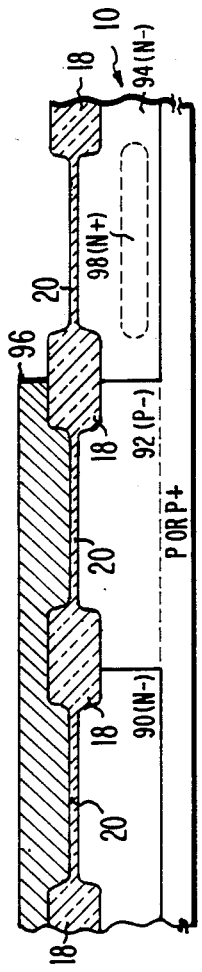
FIGS. 12 and 13 are cross-sectional views illustrating a further alternative method of the present invention for fabricating CMOS and bipolar devices in a substrate containing wells formed by a retrograde doping process.
Figure 13:
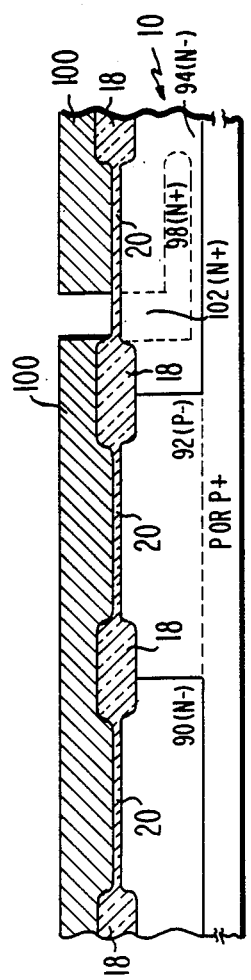

FIGS. 12 and 13 illustrate a still further alternative of the method of the present invention for forming an integrated circuit containing both MOS and bipolar transistors. The technique illustrated in FIGS. 12 and 13 should be used when a retrograde doping process, such as that disclosed by R. Mundt et al. in U.S. Pat. No. 4,578,128, entitled "Process for Forming Retrograde Dopant Distributions Utilizing Simultaneous Outdiffusion of Dopants," issued Mar. 25, 1986, which is hereby incorporated by reference, is used to form the N-wells 90 and 94. The isolation regions 18 and the gate oxide layer 20 are formed on the P-type semiconductor substrate 10 using the techniques outlined above with regard to FIG. 1. As shown in FIG. 12, after the N-wells 90 and 94 are formed using the retrograde doping operation, a photoresist layer 96 is applied over the N-well 90 and the P-type region 92. Then, an N+ buried collector 98 is formed in the N-well 94 where the NPN bipolar transistor is to be located. This buried collector 98 is formed by implanting phosphorus into the N-well 94 using an energy in the range of about 800 keV to 1.5 MeV and a dosage in the range of about $1 \times 10^{14} - 1 \times 10^{15}$ cm$^{-2}$. Then, the photoresist layer 96 is removed using a conventional solvent.

As shown in FIG. 13, an additional photoresist layer 100 is deposited over the entire device and patterned so that only a small portion of the N-well 94 is left exposed. Phosphorus is again implanted into the N-well 94 using an energy in the range of about 400-750 keV and a dosage in the range of about $5 \times 10^{13} - 5 \times 10^{14}$ cm$^{-2}$. This implant forms the N-type heavily doped region 102 which connects the buried collector 98 to the surface portion of the N-well 94. The photoresist layer 100 is then removed using a conventional solvent and the device is then completed using the same process steps illustrated in FIGS. 2-6. The process sequence of FIGS. 12-13 is used to reduce the collector series resistance of the NPN bipolar transistor formed in the retrograde N-well 94.

By using the process of the present invention wherein the pocket regions for the MOS transistors are formed simultaneously with the base region for the bipolar transistor, a NPN bipolar transistor can be formed using CMOS process technology without adding any additional ion implantation steps. The only additional process step which must be carried out when forming the NPN bipolar transistor is the application and subsequent patterning of the photoresist layer 34 in FIG. 3. This photoresist layer is needed so that the emitter, base contact and collector contacts can be defined. Also, the process of the present invention allows for a high density CMOS integrated circuit to be fabricated because the pocket regions formed in the MOS devices substantially eliminate the short channel effect. The NPN transistor fabricated through the process of the present invention is then connected to the output side of the CMOS device so as to increase the output current of the CMOS circuit.

I claim:

1. A method of fabricating an integrated circuit including at least one complementary metal-oxide-semiconductor device and at least one bipolar transistor in the same semiconductor substrate of a first conductivity type, comprising the steps of:
    (a) forming a plurality of spaced regions of a second conductivity type adjacent a surface of the semiconductor substrate, thereby defining at least one region of a first conductivity type therebetween;
    (b) simultaneously forming pocket regions in the region of a first conductivity type, for receiving device regions where a metal-oxide-semiconductor device having a channel region of a first conductivity type is to be located, and a base region in the region of a second conductivity type where a bipolar transistor is to be located, said base region being of a first conductivity type;

(c) forming pocket regions in a region of a second conductivity type, for receiving device regions where a metal-oxide-semiconductor device having a channel region of a second conductivity type is to be located;

(d) simultaneously forming source and drain device regions for the metal-oxide-semiconductor device having a channel region of a first conductivity type and an emitter region and a collector contact doped region for the bipolar transistor to be located in the region of a second conductivity type; and (e) simultaneously forming source and drain device regions for the metal-oxide-semiconductor device having a channel region of the second conductivity type and a base contact region for the bipolar transistor located in the region of a second conductivity type.

2. A method of fabricating an integrated circuit according to claim 1, further comprising the steps of:

forming before step (b) a gate oxide on at least the areas which overlie the regions where the metal-oxide-semiconductor devices are to be located; and then forming gate electrodes on the gate oxide which overlies the regions where the metal-oxide-semiconductor devices are to be located.

3. A method of fabricating an integrated circuit according to claim 2, further comprising the steps of:

simultaneously forming before step (d) a spacer oxide on the sidewalls of said gate electrodes and an oxide layer over said substrate between the areas where the emitter, base contact and collector contact will be located for the bipolar transistor.

4. A method of fabricating an integrated circuit according to claim 1, further comprising the step of:

forming after step (a) a collector region of a first conductivity type in a region of a second conductivity type where an additional bipolar transistor is to be located.

5. A method of fabricating an integrated circuit according to claim 4, further comprising the steps of:

during step (c) simultaneously forming in the collector region of a first conductivity type a base region for the additional bipolar transistor, said base region for the additional bipolar transistor being of a second conductivity type;

during step (d) simultaneously forming a base contact for the additional bipolar transistor; and during step (e) simultaneously forming the emitter region and collector contact for the additional bipolar transistor.

6. A method of fabricating an integrated circuit according to claim 1, further comprising the steps of:

forming a heavily doped buried collector of a second conductivity type in said region of a second conductivity type where said at least one bipolar transistor is to be formed using a first ion implantation technique; and connecting said buried collector to the surface of said substrate by forming a heavily doped region of a second conductivity type using a second ion implantation technique.

7. A method of fabricating an integrated circuit according to claim 6 wherein said plurality of regions of first and second conductivity types are formed using a retrograde doping process.

* * * * *